(12) United States Patent
Yamasaki et al.

(10) Patent No.: US 7,078,341 B2
(45) Date of Patent: Jul. 18, 2006

(54) METHOD OF DEPOSITING METAL LAYERS FROM METAL-CARBONYL PRECURSORS

(75) Inventors: Hideaki Yamasaki, Kofu (JP); Tsukasa Matsuda, Yamanashi (JP); Atsushi Gomi, Yamanashi (JP); Tatsuo Hatano, Ryuo (JP); Masahito Sugiura, Minami-Alps (JP); Yumiko Kawano, Kofu (JP); Gert J Leusink, Saltpoint, NY (US); Fenton R McFeely, Ossining, NY (US); Sandra G. Malhotra, Beacon, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/673,648

(22) Filed: Sep. 30, 2003

(65) Prior Publication Data
US 2005/0079708 A1   Apr. 14, 2005

(51) Int. Cl.
*H01L 21/44* (2006.01)
(52) U.S. Cl. ............ 438/680; 438/681; 438/683; 427/250; 427/255; 427/255.1
(58) Field of Classification Search ............ 427/250, 427/255, 255.1; 438/680, 681, 683
See application file for complete search history.

(56) References Cited

U.S. PATENT DOCUMENTS

| | | | |
|---|---|---|---|
| 4,619,840 A | 10/1986 | Goldman et al. | |
| 4,741,928 A * | 5/1988 | Wilson et al. | 438/669 |
| 5,789,312 A | 8/1998 | Buchanan et al. | |
| 6,091,122 A | 7/2000 | Buchanan et al. | |
| 6,218,301 B1 | 4/2001 | Yoon et al. | |
| 6,444,263 B1 | 9/2002 | Paranjpe et al. | 427/250 |
| 6,660,330 B1 * | 12/2003 | Locke et al. | 427/250 |
| 6,827,978 B1 * | 12/2004 | Yoon et al. | 427/250 |
| 2002/0190379 A1 | 12/2002 | Jian et al. | |
| 2003/0008070 A1 | 1/2003 | Seutter et al. | |

OTHER PUBLICATIONS

Kaplan et al., "The Deposition of Molybdenum and Tungsten Films from Vapor Decomposition of Carbonyls," Journal of the Electrochemical Society USA, vol. 117, No. 5, May 1970, pp. 693-700.

* cited by examiner

*Primary Examiner*—David Nelms
*Assistant Examiner*—Renee R. Berry
(74) *Attorney, Agent, or Firm*—Pillsbury Winthrop Shaw Pittman LLP (57) ABSTRACT

A method for depositing metal layers on semiconductor substrates by a thermal chemical vapor deposition (TCVD) process. The TCVD process utilizes high flow rate of a dilute process gas containing a metal-carbonyl precursor to deposit a metal layer. In one embodiment of the invention, the metal-carbonyl precursor can be selected from at least one of $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, and $Ru_3(CO)_{12}$. In another embodiment of the invention, a method is provided for depositing a W layer from a process gas comprising a $W(CO)_6$ precursor at a substrate temperature of about 410° C. and a chamber pressure of about 200 mTorr.

40 Claims, 6 Drawing Sheets

METHOD OF DEPOSITING METAL LAYERS FROM METAL-CARBONYL PRECURSORS

FIELD OF THE INVENTION

The present invention relates to semiconductor processing, and more particularly, to a method for depositing metal layers in a thermal CVD process.

BACKGROUND OF THE INVENTION

The introduction of Cu metal into multilayer metallization schemes for manufacturing integrated circuits, can necessitate the use of diffusion barriers/liners to promote adhesion and growth of the Cu layers, and to prevent diffusion of Cu into the dielectric materials. Barriers/liners that are deposited onto dielectric materials can include refractive materials such as tungsten (W), molybdenum (Mo), and tantalum (Ta), that are non-reactive and immiscible with Cu and can offer low electrical resistivity. Current integration schemes that integrate Cu metallization and dielectric materials can require barrier/liner deposition processes at substrate temperatures below 500° C.

W layers can be formed by thermally decomposing a tungsten-containing precursor, e.g., a tungsten halide or a tungsten metal-carbonyl, in a thermal chemical vapor deposition (TCVD) process. Material properties of W layers that are deposited by thermal decomposition of metal-carbonyl precursors (e.g., $W(CO)_6$), can deteriorate when the substrate deposition temperature is lowered to below 500° C. Increase in the (electrical) resistivity of the W layers and poor surface morphology (e.g., formation of nodules) at low deposition temperatures, has been attributed to increased incorporation of CO reaction by-products into the thermally deposited W layers. Both effects can be explained by a reduced CO desorption rate from the thermal decomposition of the metal-organic precursor at substrate temperatures below 500° C.

SUMMARY OF THE INVENTION

A method is provided for depositing a metal layer on a semiconductor substrate. The metal layer is deposited in a TCVD process from a process gas comprising a metal-carbonyl precursor that is introduced in the process chamber and exposed to the substrate. High flow rate of a dilute process gas flow enables formation of a metal layer.

In one embodiment of the invention a process gas comprising a metal-carbonyl precursor can be selected from at least one of $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, and $Ru_3(CO)_{12}$, and the metal layer can be at least one of W, Ni, Mo, Co, Rh, Re, Cr, and Ru, respectively.

In another embodiment of the invention, a method is provided for depositing a W layer on a semiconductor substrate. The W layer is deposited from a process gas comprising a $W(CO)_6$ precursor at a substrate temperature of about 410° C.

BRIEF DESCRIPTION OF THE DRAWINGS

The accompanying drawings, which are incorporated in and constitute a part of the specification, illustrate embodiments of the invention, wherein.

DETAILED DESCRIPTION OF THE INVENTION

Figure 1:
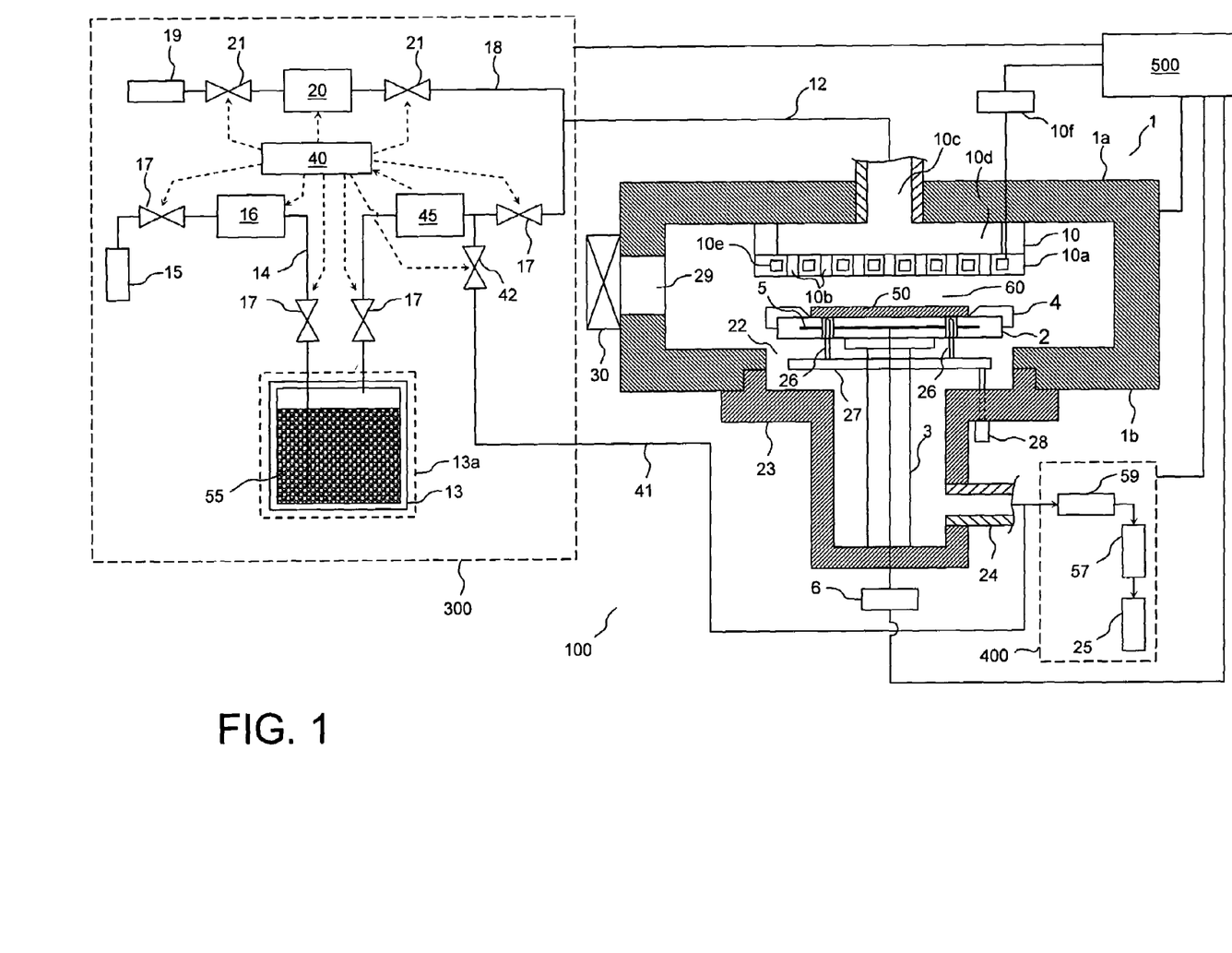
FIG. 1 is a simplified block-diagram of a processing system for depositing W layers according to an embodiment of the invention.

FIG. 1 is a simplified block-diagram of a processing system for depositing metal layers according to an embodiment of the invention. The processing system 100 comprises a process chamber 1 that contains an upper chamber section 1a, a lower chamber section 1b, and an exhaust chamber 23. A circular opening 22 is formed in the middle of lower chamber section 1b, where bottom section 1b connects to exhaust chamber 23.

Provided inside process chamber 1 is a substrate holder 2 for horizontally holding a substrate (wafer) 50 to be processed. The substrate holder 2 is supported by a cylindrical support member 3, which extends upward from the center of the lower part of exhaust chamber 23. A guide ring 4 for positioning the substrate 50 on the substrate holder 2 is provided on the edge of substrate holder 2. Furthermore, the substrate holder 2 contains a heater 5 that is controlled by power source 6, and is used for heating the substrate 50. The heater 5 can be a resistive heater. Alternately, the heater 5 may be a lamp heater or any other type of heater.

During processing, the heated substrate 50 can thermally decompose a $W(CO)_6$ precursor and enables deposition of a W layer on the substrate 50. The substrate holder 2 is heated to a pre-determined temperature that is suitable for depositing the desired W layer onto the substrate 50. A heater (not shown) is embedded in the walls of process chamber 1 to heat the chamber walls to a pre-determined temperature. The heater can maintain the temperature of the walls of process chamber 1 from about 40° C. to about 80° C.

A showerhead 10 is located in the upper chamber section 1a of process chamber 1. Showerhead plate 10a at the bottom of showerhead 10 contains multiple gas delivery holes 10b for delivering a process gas comprising the $W(CO)_6$ precursor into a processing zone 60 located above the substrate 50. The processing zone 60 is a volume defined by the substrate diameter and by the gap between the substrate 50 and the showerhead 10.

An opening 10c is provided in the upper chamber section 1b for introducing a process gas from gas line 12 into a gas distribution compartment 10d. Concentric coolant flow channels 10e are provided for controlling the temperature of the showerhead 10 and thereby preventing the decomposition of the $W(CO)_6$ precursor gas inside the showerhead 10. A coolant fluid such as water, can be supplied to the coolant flow channels 10e from a coolant fluid source 10f for controlling the temperature of showerhead 10 from about 20° C. to about 100° C.

The gas line 12 connects the precursor delivery system 300 to process chamber 1. A precursor container 13 contains a solid $W(CO)_6$ precursor 55, and a precursor heater 13a is provided for heating the precursor container 13 to maintain the $W(CO)_6$ precursor 55 at a temperature that produces a desired vapor pressure of the $W(CO)_6$ precursor. The $W(CO)_6$ precursor 55 can comprise a relatively high vapor pressure, $P_{vap}$~1 Torr at 65° C. Therefore, only moderate heating of the precursor source 13 and the precursor gas delivery lines (e.g., gas line 12) is required for delivering the $W(CO)_6$ precursor to the process chamber 1. Furthermore, the $W(CO)_6$ precursor does not thermally decompose at temperatures below about 200° C. This can significantly reduce decomposition of the $W(CO)_6$ precursor due to interactions with heated chamber walls and gas phase reactions.

In one embodiment, $W(CO)_6$ precursor vapor can be delivered to the process chamber 1 without the use of a carrier gas or, alternatively, a carrier gas can be used to enhance the delivery of the precursor vapor to the process chamber 1. Gas line 14 can provide a carrier gas from gas source 15 to the precursor container 13, and a mass flow controller (MFC) 16 and valves 17 can be used to control the carrier gas flow. When a carrier gas is used, it may be introduced into the lower part of precursor container 13 so as to percolated through the solid $W(CO)_6$ precursor 55. Alternatively, the carrier gas may be introduced into the precursor source 13 and distributed across the top of the solid $W(CO)_6$ precursor 55. A sensor 45 is provided for measuring the total gas flow from the precursor container 13. The sensor 45 can, for example, comprise a MFC, and the amount of $W(CO)_6$ precursor delivered to the process chamber 1 can be determined and controlled using sensor 45 and valves 17. Alternatively, the sensor 45 can comprise a light absorption sensor to measure the concentration of the $W(CO)_6$ precursor in the gas flow to the process chamber 1.

A bypass line 41 is located downstream from sensor 45 and connects gas line 12 to exhaust line 24. Bypass line 41 is provided for evacuating gas line 12 and for stabilizing the supply of the $W(CO)_6$ precursor to the process chamber 1. In addition, a valve 42, located downstream from the branching of gas line 12, is provided on bypass line 41.

Heaters (not shown) are provided to independently heat gas lines 12, 14, and 41, where the temperatures of the gas lines can be controlled to avoid condensation of the $W(CO)_6$ precursor in the gas lines. The temperature of the gas lines can be controlled from about 20° C. to about 100° C., or from about 25° C. to about 60° C.

Dilution gases can be supplied from gas source 19 to gas line 12 using gas line 18. The dilution gases can be used to dilute the process gas or to adjust the process gas partial pressure(s). Gas line 18 contains a MFC 20 and valves 21. MFCs 16 and 20, and valves 17, 21, and 42 are controlled by controller 40, which controls the supply, shutoff, and the flow of a carrier gas, the $W(CO)_6$ precursor gas, and a dilution gas. Sensor 45 is also connected to controller 40 and, based on output of the sensor 45, controller 40 can control the carrier gas flow through mass flow controller 16 to obtain the desired $W(CO)_6$ precursor flow to the process chamber 1.

Exhaust line 24 connects exhaust chamber 23 to vacuum pumping system 400. Vacuum pump 25 is used to evacuate process chamber 1 to the desired degree of vacuum and to remove gaseous species from the process chamber 1 during processing. An automatic pressure controller (APC) 59 and a trap 57 can be used in series with the vacuum pump 25. The vacuum pump 25 can include a turbo-molecular pump (TMP) capable of a pumping seed up to 800 liters per second (and greater). Alternatively, the vacuum pump 25 can include a dry pump. During processing, the process gas can be introduced into the process chamber 1 and the chamber pressure adjusted by the APC 59. The APC 59 can comprise a butterfly-type valve or a gate valve. The trap 57 can collect unreacted precursor material and by-products from the process chamber 1.

In the process chamber 1, three substrate lift pins 26 (only two are shown) are provided for holding, raising, and lowering the substrate 50. The substrate lift pins 26 are affixed to plate 27, and can be lowered to below to the upper surface of substrate holder 2. A drive mechanism 28 utilizing, for example, an air cylinder, provides means for raising and lowering the plate 27. A substrate 50 can be transferred in and out of process chamber 1 through gate valve 30 and chamber feed-through passage 29 via a robotic transfer system (not shown) and received by the substrate lift pins. Once the substrate 50 is received from the transfer system, it can be lowered to the upper surface of the substrate holder 2 by lowering the substrate lift pins 26.

A processing system controller 500 includes a microprocessor, a memory, and a digital I/O port capable of generating control voltages sufficient to communicate and activate inputs of the processing system 100 as well as monitor outputs from the processing system 100. Moreover, the processing system controller 500 is coupled to and exchanges information with process chamber 1, precursor delivery system 300 that includes controller 40 and precursor heater 13a, vacuum pumping system 400, power source 6, and coolant fluid source 10f. In the vacuum pumping system 400, the processing system controller 500 is coupled to and exchanges information with the automatic pressure controller 59 for controlling the pressure in the process chamber 1. A program stored in the memory is utilized to control the aforementioned components of a processing system 100 according to a stored process recipe. One example of processing system controller 500 is a DELL PRECISION WORKSTATION 610™, available from Dell Corporation, Dallas, Tex.

Figure 2:
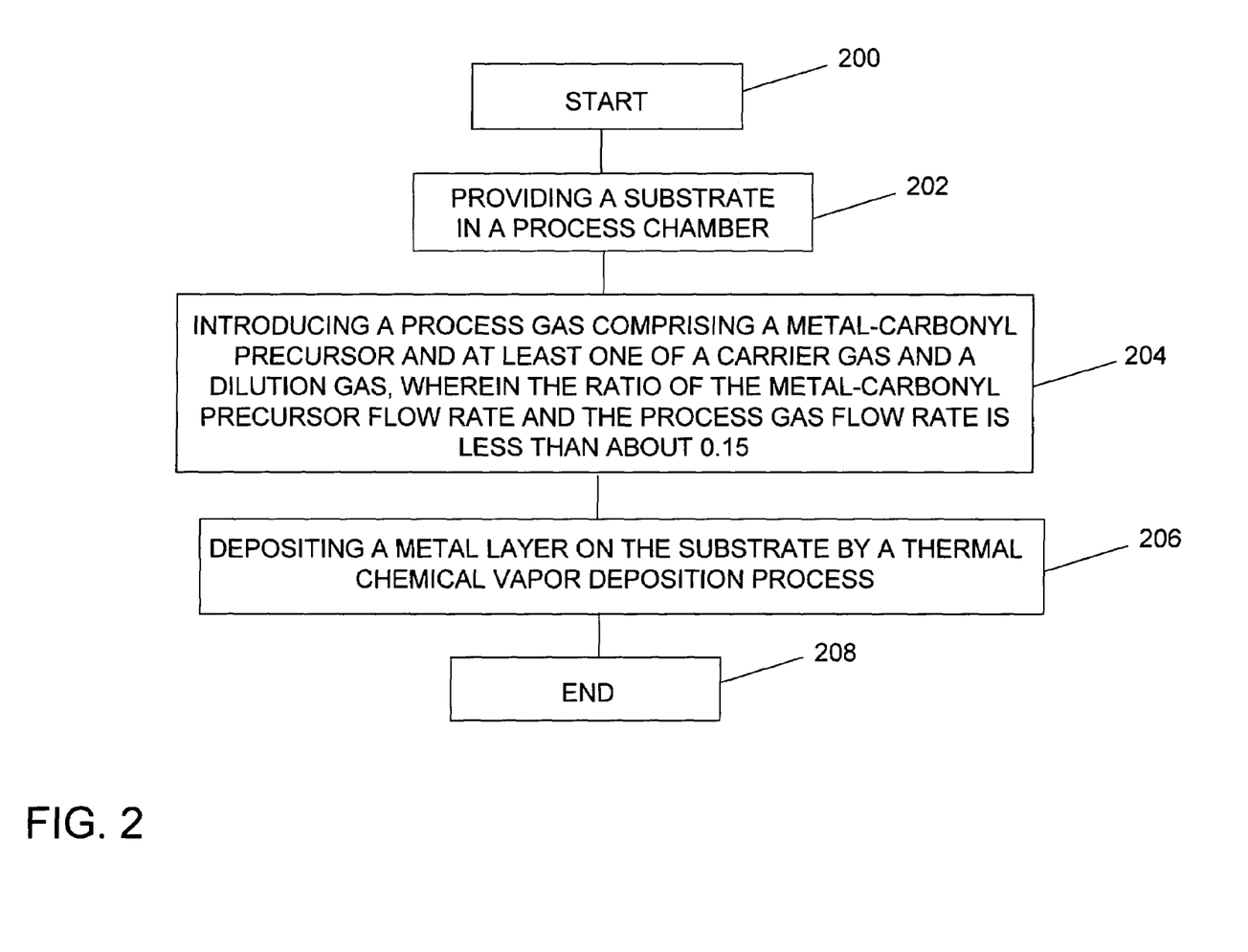
FIG. 2 shows a flowchart for depositing a W layer according to an embodiment of the invention.

FIG. 2 shows a flowchart for depositing a metal layer according to an embodiment of the invention. At 200, the process is started. At 202, a substrate is provided in a process chamber. At 204, a high flow rate of a dilute process gas comprising a metal-carbonyl precursor is introduced in the process chamber. The process gas comprises a metal-carbonyl precursor gas and at least one of a dilution gas and a carrier gas, wherein the ratio of the metal-carbonyl precursor gas flow rate and the process gas flow rate is less than about 0.15. Alternatively, the ratio can be less than about 0.10 or about 0.0625. At 206, a metal layer is deposited on the substrate by a low-pressure TCVD deposition process, where the high flow rate of the dilute process gas enables formation of a low-resistivity metal layer with improved morphology. At 208, the process ends.

In general, the invention can be applied to deposition of metal barriers/liners from the corresponding metal-carbonyl precursors. This includes deposition of W, Ni, Mo, Co, Rh, Re, Cr, and Ru metal layers from $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, and $Ru_3(CO)_{12}$ precursors, respectively. The low-temperature deposition of low-resistivity metal layers according to the invention, allows integration of metal layers into back-end-of-line (BEOL) processing schemes that require substrate temperatures between about 400° C. and about 500° C., or lower. Of course, the process also can be employed at higher substrate temperatures.

In principle, a reducing agent is not needed for thermally depositing metal layers from metal-carbonyl precursors, because the metal atom in the metal-carbonyl precursor is already zero-valent. Alternatively, a reducing agent, e.g., a $H_2$ gas, can be employed to aid in the deposition of a metal layer. Thermal decomposition of metal-carbonyl precursors and subsequent metal deposition, is thought to proceed predominantly by CO elimination and desorption of CO by-products from the substrate. Incorporation of CO by-products into the metal layers during deposition can result from incomplete decomposition of the metal-carbonyl precursor, incomplete removal of CO by-products from metal layer, and re-adsorption of CO by-products from the process chamber onto the metal layer.

It is believed that CO incorporation into a metal layer during deposition, leads to surface roughness in the form of nodules in the metal layer, where the growth of nodules is enhanced by increased incorporation of CO by-products into the metal layer. The number of nodules is expected to increase as the thickness of the metal layer increases. Furthermore, the incorporation of CO by-products into the metal layer increases the resistivity of the metal layer.

Incorporation of CO-byproducts into the metal layer can be reduced by (1) lowering the process pressure, (2) increasing the substrate temperature, and (3) using a high flow rate of a dilute process gas. In one embodiment of the invention, a high flow rate of a dilute process gas is effective in controlling the partial pressure of CO by-products on the metal layer and the partial pressure of CO in the process chamber, thereby reducing the number of nodules in the metal layer.

Table I shows process conditions and results for W layers deposited by a low-pressure TCVD process according to an embodiment of the invention. The W layers were deposited on thermally grown $SiO_2$ layers at a substrate temperature of about 410° C. and a process pressure of 200 mTorr. The deposition time in Run I was 600 sec. and was 1200 sec. in Run II. The average resistivity was normalized to a W layer thickness of 50 nm.

TABLE I

|  | Run I | Run II |
| --- | --- | --- |
| Ar Carrier Gas Flow (sccm) | 15 | 15 |
| Dilution Gas Flow (sccm) | 325 | 325 |
| Precursor Gas Flow (sccm) | 60 | 60 |
| Process gas Flow (sccm) | 400 | 400 |
| Deposition Time (sec.) | 600 | 1200 |
| Deposition Rate (A/min.) | 5.1 | 4.9 |
| Layer Thickness (A) | 51 | 98 |
| Average Resistivity | 56.8 μohm-cm | |

Figure 3A:
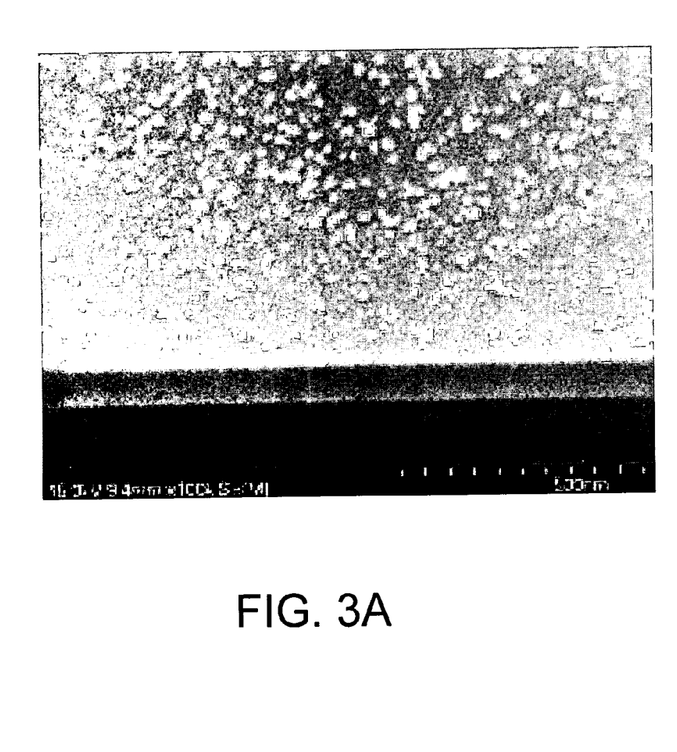
FIGS. 3A and 3B show cross-sectional SEM micrographs (tilted 30 deg) for W layers deposited by a low-pressure TCVD process according to the process conditions listed in TABLE I for Runs I and II, respectively.
Figure 3B:
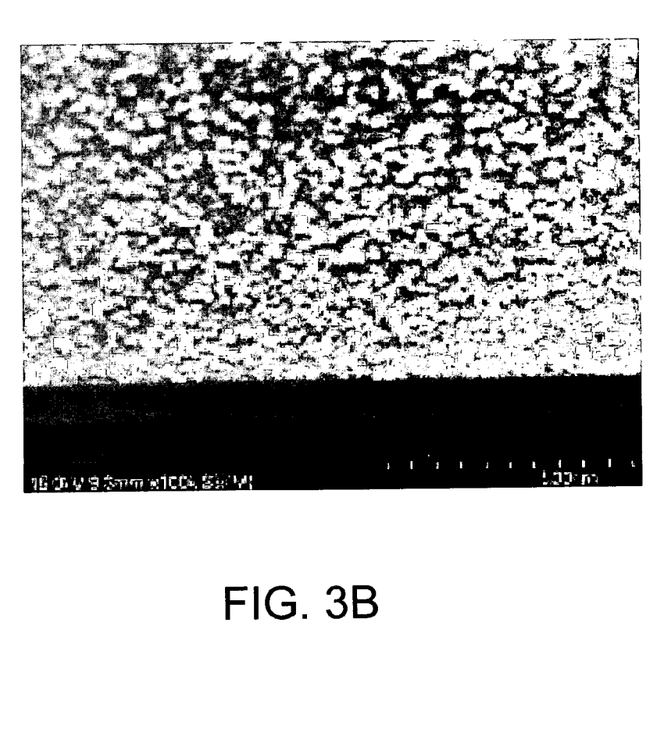

FIGS. 3A and 3B show cross-sectional SEM micrographs (tilted 30 deg) for W layers deposited by a low-pressure TCVD process according to the process conditions listed in TABLE I for Runs 1 and II, respectively. Comparison of the W layers FIGS. 3A and 3B shows that the surface of the thicker W layer in FIG. 3B is rougher and contains a larger number of nodules than the surface of the thinner W layer in FIG. 3A.

Table II shows process conditions and results for W layers deposited by a low-pressure TCVD process according to an embodiment of the invention. Other than as specified, process conditions were the same as set forth with regard to Runs I and II. The deposition time in Run IV was 600 sec. and was 1200 sec. in Run III.

TABLE II

|  | Run III | Run IV |
| --- | --- | --- |
| Ar Carrier Gas Flow (sccm) | 20 | 20 |
| Dilution Gas Flow (sccm) | 880 | 880 |
| Precursor Gas Flow (sccm) | 60 | 60 |
| Process Gas Flow (sccm) | 960 | 960 |
| Deposition Time (sec.) | 600 | 1200 |
| Deposition Rate (A/min) | 4.4 | 4.7 |
| Layer Thickness | 44A | 95A |
| Average Resistivity | 39.6 μohm-cm | |

Figure 4A:
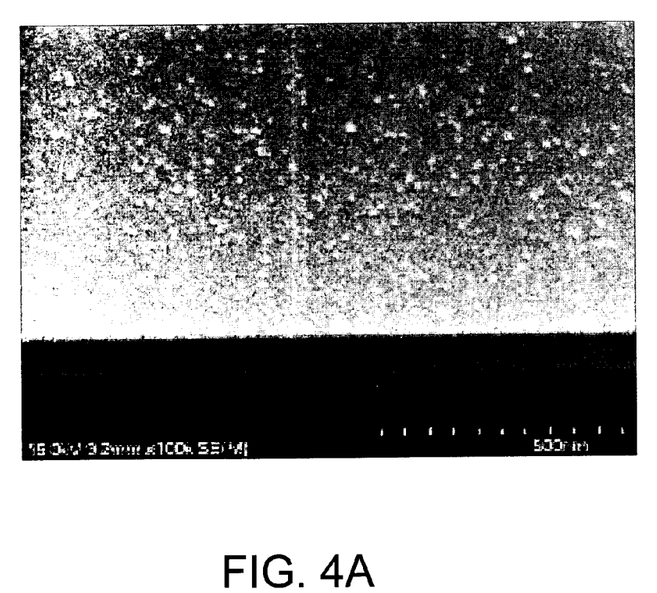
FIGS. 4A and 4B show cross-sectional SEM micrographs (tilted 30 deg) for W layers deposited by a low-pressure TCVD process according to the process conditions listed in TABLE II for Runs III and IV, respectively.
Figure 4B:
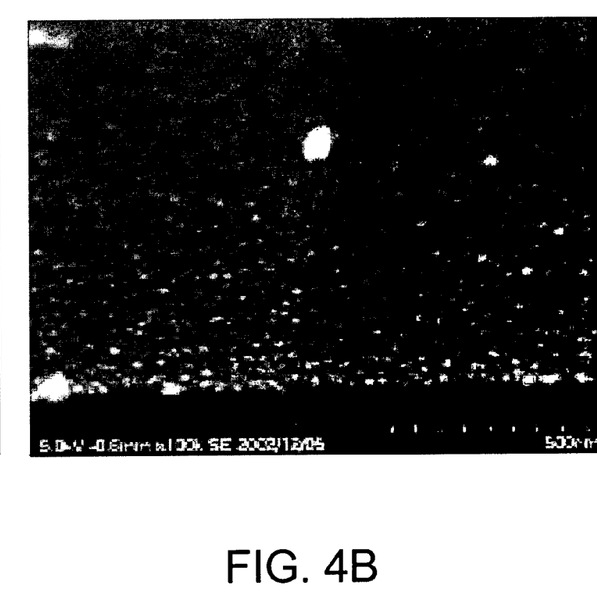

FIGS. 4A and 4B show cross-sectional SEM micrographs (tilted 30 deg) for W layers deposited by a low-pressure TCVD process according to the process conditions listed in TABLE II for Runs III and IV, respectively. Comparison of the W layers in FIGS. 4A and 4B shows that the surface of the thicker W layer in FIG. 4B is rougher and contains a larger number of nodules than the surface of the thinner W layer in FIG. 4A.

Figure 5A:
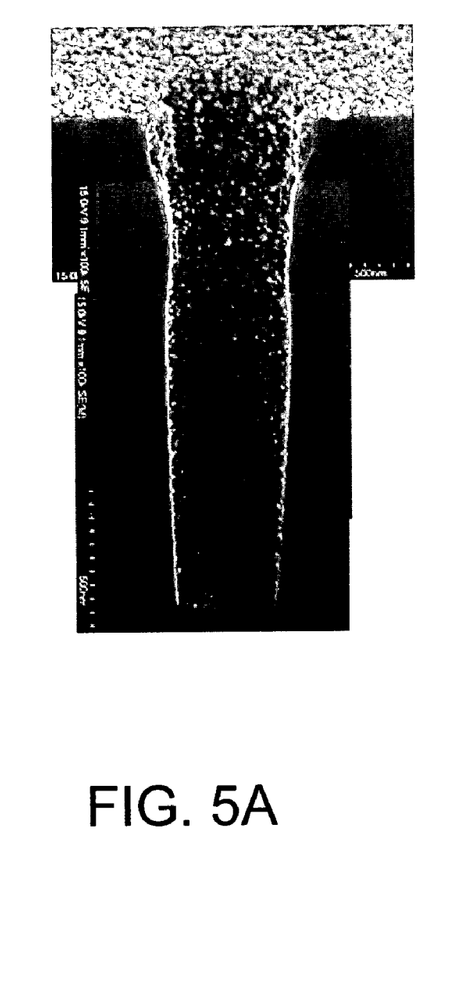
FIGS. 5A and 5B show cross-sectional SEM micrographs for a W layer deposited on a microstructure by a low-pressure TCVD process according to the process conditions listed in TABLES I and II, respectively.
Figure 5B:
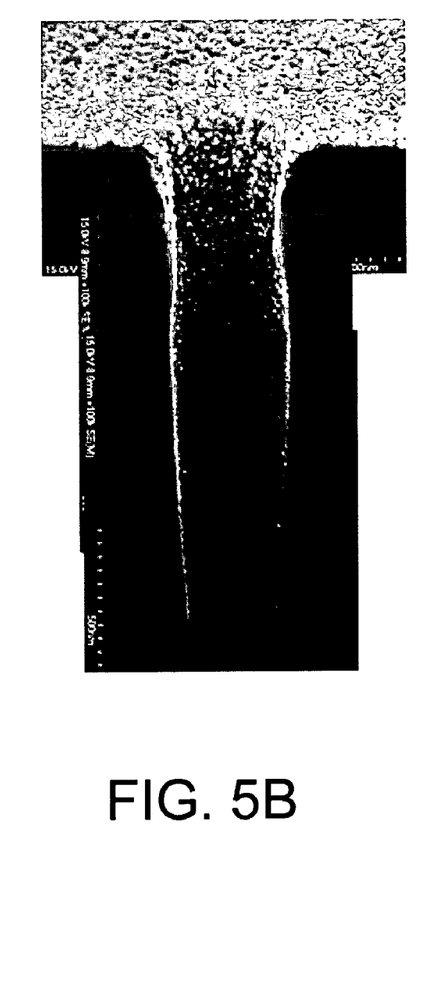
Figure 6A:
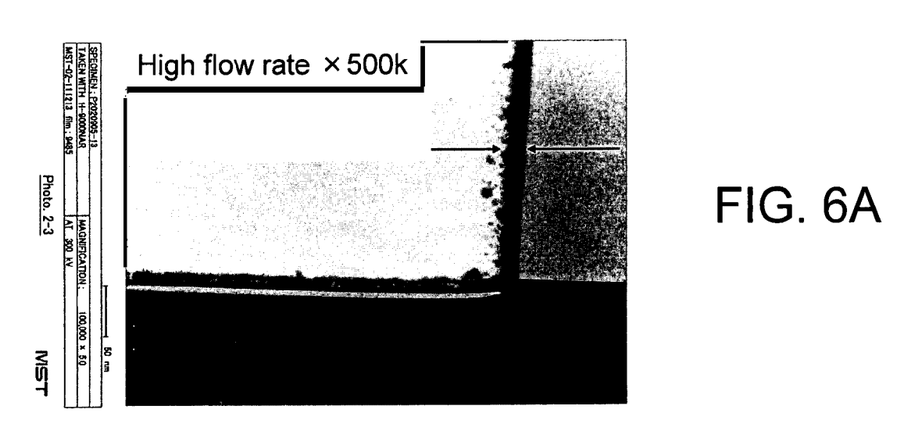
FIGS. 6A and 6B show cross-sectional SEM micrographs for W layers deposited by a low-pressure TCVD process according to an embodiment of the invention.
Figure 6B:
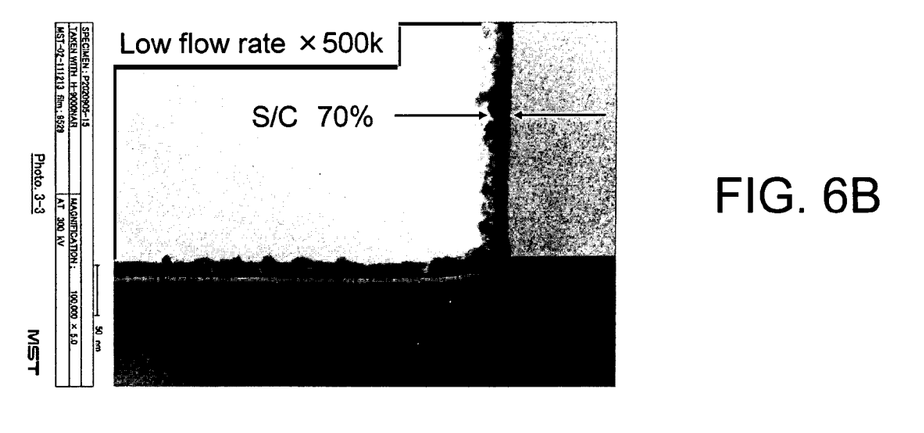

The higher flow rate of a more dilute process gas in Table II decreases the number of nodules in the W layer, and decreases the resistivity of the W layer. In Table I, the ratio of the $W(CO)_6$ precursor gas flow rate and the process gas flow rate is 0.15. The corresponding ratio is reduced to 0.0625 for the process conditions in Table II. The lower resistivity and improved morphology of the W layer can be explained by enhanced removal of CO by-products from the processing chamber as the ratio of the $W(CO)_6$ precursor gas flow rate and the process gas flow rate is changed from 0.15 to 0.0625. A higher process gas flow rate enhances the removal rate of CO and other by-products from the process chamber, resulting in deposition of a low-resistivity W layer with low impurity content and improved morphology. The ratio of the $W(CO)_6$ precursor gas flow rate and the process gas flow rate can be reduced to below 0.0625 to further improve the material properties of the W layer. The process parameter space for the TCVD process can, for example, utilize a chamber pressure less than about 300 mTorr. Alternatively, the chamber pressure can be less than about 200 mTorr or less than about 100 mTorr. A carrier gas flow rate can be less than about 1000 sccm. A dilution gas flow rate can be less than about 2000 sccm. A precursor gas flow rate can be between about 0.1 sccm and about 200 sccm. The process gas flow rate can be greater than about 400 sccm. The carrier gas and the dilution gas can comprise at least one of an inert gas and a $H_2$ gas. The inert gas can comprise at least one of Ar, He, Ne, Kr, Xe, and $N_2$. The ratio of the $W(CO)_6$ precursor gas flow rate and the process gas flow rate can be less than about 0.15 for depositing W layers with good material properties. The substrate temperature can be varied from about 300° C. to about 600° C. FIGS. 5A and 5B show cross-sectional SEM micrographs for a W layer deposited on a microstructure by a low-pressure TCVD process using the processing conditions listed in TABLES 1 and II, respectively. Visual comparison of the W layers in FIGS. 5A and 5B, show that the W layer in FIG. 5B has improved morphology (reduced density of nodules on the sidewall of the microstructure) compared to the W layer in FIG. 5A. FIGS. 6A and 6B show cross-sectional SEM micrographs for W layers deposited by a low-pressure TCVD process according to an embodiment of the invention. The W layers in FIGS. 6A and 6B were deposited using a precursor container temperature of about 30° C. and a process pressure of about 150 mTorr. The W layer in FIG. 6A was deposited using a carrier gas flow of about 65 sccm, a dilution gas flow of about 390 sccm, and a deposition time of about 500 sec., whereas the W layer in FIG. 6B was deposited using a carrier gas flow of about 25 sccm, a dilution gas flow of about 200 sccm, and a deposition time of about 600 sec. The step coverage of the W layer in FIG. 6A, deposited using a high process gas flow is about 90%, whereas the step coverage of the W layer in FIG. 6B, deposited using a lower process gas flow is about 70%.

It should be understood that various modifications and variations of the present invention may be employed in practicing the invention. It is therefore to be understood that, within the scope of the appended claims, the invention may be practiced otherwise than as specifically described herein.

What is claimed is:

1. A method of depositing a metal layer on a semiconductor substrate, the method comprising:
   providing a substrate in a process chamber;
   introducing a process gas in the process chamber, the process gas comprising a metal-carbonyl precursor gas and at least one of a dilution gas and a carrier gas, wherein the ratio of the metal-carbonyl precursor gas flow rate and the process gas flow rate is less than about 0.15; and
   depositing a metal layer on the substrate by a thermal chemical vapor deposition process.

2. The method according to claim 1, wherein the ratio of the metal-carbonyl precursor gas flow rate and the process gas flow rare is less than about 0.10.

3. The method according to claim 1, wherein the ratio of the metal-carbonyl precursor gas flow rate and the process gas flow rate is about 0.062 5.

4. The method according to claim 1, wherein rite process gas includes the carrier gas comprising an inert gas.

5. The method according to claim 4, wherein the inert gas comprises at least one Ar, He, Ne, Kr, Xe, and $N_2$.

6. The method according to claim 1, wherein the process gas includes the carrier gas comprising a reducing gas.

7. The method according to claim 6, wherein the reducing gas comprises $H_2$.

8. The method according to claim 1, wherein the process gas includes the dilution gas comprising an inert gas.

9. The method according to claim 8, wherein the inert gas comprises at least opt Ar, He, Ne, Kr, Xe, and $N_2$.

10. The method according to claim 1, wherein the process gas includes the dilution gas comprising a reducing gas.

11. The method according to claim 10, wherein the reducing gas comprises $H_2$.

12. The method according to claim 1, wherein the metal-carbonyl gas flow raze is between about 0.1 sccm to about 200 sccm.

13. The method according to claim 4, wherein the carrier gas flow rate is less than about 1000 sccm.

14. The method according to claim 1, wherein the process gas includes the dilution gas having a flow rate less than about 2000 sccm.

15. The method according to claim 1, wherein the process gas flow rare is greater than about 400 sccm.

16. The method according to claim 1, wherein the chamber pressure is less than about 200 mTorr.

17. The method according to claim 1, wherein the chamber pressure is less than about 100 mTorr.

18. The method according to claim 1, wherein the substrate temperature is less than about 500° C.

19. The method according to claim 1, wherein the substrate temperature is less than about 400° C.

20. The method according to claim 1, wherein the metal-carbonyl precursor comprises at least one of $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, and $Ru_3(CO)_{12}$.

21. The method according to claim 1, wherein the metal layer comprises at least one of W, Ni, Mo, Ca, Rb, Re, Cr, and Ru.

22. A method of depositing a W layer, the method comprising:
   providing a substrate in a process chamber;
   flowing a process gas in the process chamber, the process gas comprising a $W(CO)_6$ precursor gas and at least one of a dilution gas and a carrier gas, wherein the ratio of the $W(CO)_6$ precursor gas flow raze and the process gas flow rate is less than about 0.15; and
   depositing a W layer on the substrate by a thermal chemical vapor deposition process.

23. The method according to claim 22, wherein the ratio of the $W(CO)_6$ precursor gas flow rate and The process gas flow rate is less than about 0.10.

24. The method according to claim 22, wherein the ratio of the $W(CO)_6$ precursor gas flow rate and the process gas flow rate is about 0.0625.

25. The method according to claim 22, wherein the process gas includes the carder gas comprising an inert gas.

26. The method according to claim 25, wherein the inert gas comprises at least one Ar, He, Ne, Kr, Xe, and $N_2$.

27. The method according to claim 22, wherein the process gas includes the carrier gas comprising a reducing gas.

28. The method according to claim 27, wherein the reducing gas comprises $H_2$.

29. The method according to claim 22, wherein the process gas includes the dilution gas comprising an inert gas.

30. The method according to claim 29, wherein the inert gas comprises at least one of Ar, He, We, Kr, Xe, and $N_2$.

31. The method according to claim 22, wherein the process gas includes the dilution gas comprising a reducing gas.

32. The method according to claim 31, wherein the reducing gas comprises $H_2$.

33. The method according to claim 22, wherein the $W(CO)_6$ gas flow rate is between about 0.1 sccm and about 200 sccm.

34. The method according to claim 22, wherein the process gas includes the carrier gas having a flow rate less than about 1000 sccm.

35. The method according to claim 22, wherein the process gas includes the dilution gas having a flow rate less than about 2000 sccm.

36. The method according to claim 22, wherein the chamber pressure is less than about 200 mTorr.

37. The method according to claim 22, wherein the chamber pressure is less than about 100 mTorr.

38. The method according to claim 22, wherein the substrate temperature is less than about 500° C.

39. The method according to claim 22, wherein the substrate temperature is less than about 450° C.

40. The method according to claim 22, wherein the substrate temperature is about 410° C.

* * * * *